(12) United States Patent
Otsuka et al.

(10) Patent No.: US 7,656,925 B2
(45) Date of Patent: Feb. 2, 2010

(54) TWO-DIMENSIONAL PHOTONIC CRYSTAL SURFACE EMITTING LASER

(75) Inventors: Koji Otsuka, Kyoto (JP); Eiji Miyai, Kyoto (JP); Kyosuke Sakai, Kyoto (JP); Yoshitaka Kurosaka, Kyoto (JP); Susumu Noda, Uji (JP); Dai Ohnishi, Kyoto (JP); Wataru Kunishi, Kyoto (JP)

(73) Assignees: Kyoto University, Kyoto (JP); Rohm Co., Ltd., Kyoto (JP)

( * ) Notice: Subject to any disclaimer, the term of this patent is extended or adjusted under 35 U.S.C. 154(b) by 119 days.

(21) Appl. No.: 12/076,914

(22) Filed: Mar. 25, 2008

(65) Prior Publication Data
US 2008/0240179 A1 Oct. 2, 2008

(30) Foreign Application Priority Data
Mar. 26, 2007 (JP) .............................. 2007-079639

(51) Int. Cl.
*H01S 5/00* (2006.01)

(52) U.S. Cl. .............................. 372/50.124; 372/46.014
(58) Field of Classification Search ............ 372/46.013, 372/46.014, 46.015, 50.124
See application file for complete search history.

(56) References Cited

FOREIGN PATENT DOCUMENTS

JP    A 2000-332351    11/2000

*Primary Examiner*—Armando Rodriguez
(74) *Attorney, Agent, or Firm*—Oliff & Berridge, PLC

(57) ABSTRACT

The two-dimensional photonic crystal surface emitting laser according to the present invention includes a number of main modified refractive index areas periodically provided in a two-dimensional photonic crystal and secondary structures each relatively located in a similar manner to each of the main modified refractive index areas. The location of the secondary structure is determined so that a main reflected light which is reflected by a main modified refractive index area and a secondary reflected light which is reflected by a secondary structure are weakened or intensified by interference.

17 Claims, 8 Drawing Sheets

(A) WITHOUT SECONDARY STRUCTURE (B) WITH SECONDARY STRUCTURE

US 7,656,925 B2

TWO-DIMENSIONAL PHOTONIC CRYSTAL SURFACE EMITTING LASER

TECHNICAL FIELD

The present invention relates to a two-dimensional photonic crystal surface emitting laser for emitting laser light in a direction perpendicular to the surface of a flat light source. It should be noted that the term "light" or "optical" used in the present patent application includes electromagnetic waves in general as well as visible light.

BACKGROUND OF THE INVENTION

In recent years, new types of laser using a photonic crystal have been developed. A photonic crystal consists of a dielectric matrix body in which an artificial periodic structure is created. Usually, the periodic structure is created by providing the matrix body with a periodic arrangement of areas whose refractive index differs from that of the material of the matrix body (this area is called the "modified refractive index area"). The periodic structure causes a Bragg diffraction within the crystal and creates an energy band gap in the energy of light that exists in the matrix body. There are two types of photonic crystal lasers; one of which utilizes a bandgap effect to use a point-like defect as a resonator, and the other utilizes a standing wave at a band edge where the group velocity of light becomes zero. Each of these photonic crystal lasers causes an oscillation of laser light by amplifying light of a predetermined wavelength.

Patent Document 1 discloses a two-dimensional photonic crystal surface emitting laser in which a two-dimensional photonic crystal is created in the vicinity of an active layer containing a light-emitting material. This two-dimensional photonic crystal is created from a plate-shaped matrix body made of a semiconductor in which areas such as holes whose refractive index differs from that of the matrix body are periodically arranged. This period distance is adjusted so that it equals the wavelength of the light within the two-dimensional photonic crystal, the light being generated in the active layer. Therefore, the light having that wavelength is intensified to create a laser oscillation. The laser light thus created is diffracted by the two-dimensional photonic crystal perpendicularly to it, which generates a surface emitting light from the surface of the two-dimensional photonic crystal.

The reason why light is amplified in a two-dimensional photonic crystal will be explained using a concrete example of a two-dimensional photonic crystal illustrated in FIG. 1. FIG. 1A is a plain view of a two-dimensional photonic crystal and FIG. 1B is a perspective view of it. This two-dimensional photonic crystal 11 consists of a plate-shaped matrix body 12 in which cylindrical holes 13 are arranged in a square lattice pattern. This square lattice has a period distance "α" which equals the wavelength of the light introduced into the two-dimensional photonic crystal 11 from the active layer. The light introduced into the two-dimensional photonic crystal 11 propagates within the two-dimensional photonic crystal 11 and is reflected 180 degrees by the holes 13 (FIG. 1A). If only one hole 131 is observed, the optical path difference between the light reflected 180 degrees at the hole 131 and the light reflected 180 degrees at the hole 132 which is adjacent to the hole 131 is "2α", i.e. two times as long as these lights' wavelength. Therefore, the lights are intensified by interference. Repeated interferences at each hole 13 amplify lights in the two-dimensional photonic crystal 11. This phenomenon is called the feedback effect. Some of the lights amplified are diffracted in a direction perpendicular to the surface of the two-dimensional photonic crystal 11 by the holes 13 (FIG. 1B). Since the optical path difference between the lights reflected in a perpendicular direction at the holes 131 and 132 which are adjacent to each other is "α", i.e. as long as the wavelength of these perpendicularly reflected lights, the lights emitted in a perpendicular direction are also amplified by an interference. Such amplification action generates surface emitting laser light in a direction perpendicular to the surface of the two-dimensional photonic crystal 11.

Patent Document 1: Japanese Unexamined Patent Application Publication No. 2000-332351 (Paragraphs [0037] to [0056], FIG. 1)

It can be thought that, in a two-dimensional photonic crystal surface emitting laser, the larger the area of an active layer and that of a two-dimensional photonic crystal become, the larger the emission area becomes, which yields higher output. However, if a two-dimensional photonic crystal's area becomes larger, the number of the modified refractive index areas which surround a modified refractive index area located in the vicinity of the center region of the two-dimensional photonic crystal becomes larger in comparison to the number of the modified refractive index areas which surround a modified refractive index area located on the edge of the two-dimensional photonic crystal. Hence, the feedback light's intensity increases in the vicinity of the center of the two-dimensional photonic crystal, which makes lights in the two-dimensional photonic crystal more likely to be localized in the vicinity of the center.

If the localization of lights occurs as just described, it is not possible to generate laser light having a single wavelength since electric charges externally injected for causing the active layer to emit light are spatially distributed in the two-dimensional photonic crystal and the refractive index of the matrix body is hence spatially distributed as well. If the feedback effect is reduced in some way, such a localization of lights can be abated; however, if the feedback effect is reduced too much, then a laser oscillation will not be generated. Given this factor, it is necessary to adjust the feedback effect so that these two conflicting effects are balanced.

Conventionally, however, how to reduce or increase the feedback effect in a two-dimensional photonic crystal has not been studied.

SUMMARY OF THE INVENTION

The problem to be solved by the present invention is to provide a two-dimensional photonic crystal surface emitting laser capable of adjusting (i.e. reducing or increasing) the intensity of the feedback light on demand in a two-dimensional photonic crystal.

The two-dimensional photonic crystal surface emitting laser according to the present invention includes:

a two-dimensional photonic crystal including a plate-shape matrix body in which a plurality of main modified refractive index areas having an identical shape whose refractive index differs from that of the matrix body are periodically arranged;

an active layer located on one side of the matrix body for emitting a light having a predetermined wavelength by a current injection, the light being reflected as a main reflected light of the predetermined wavelength by the main modified refractive index areas; and secondary structures arranged in the matrix body and in an identical relative position with respect to each of the main modified refractive index areas, for reflecting the light having the predetermined wavelength emitted by the active layer as a secondary reflected light of the predetermined wavelength, and the relative position being set so that the main reflected light and the secondary reflected light are interfered at a predetermined phase in a plane of the two-dimensional photonic crystal.

In order to reduce the feedback effect, e.g. to abate the localization of lights in the vicinity of the center of the crystal surface, the secondary structures may be arranged in the positions where a phase difference θ between the main reflected light and the secondary reflected light fulfills $\pi/2<\theta<(3/2)\pi$. Such an arrangement of the secondary structures causes the destructive interference between the main reflected light and the secondary reflected light.

Conversely, in order to increase the feedback effect, the secondary structures may be arranged in the positions where a phase difference θ between the main reflected light and the secondary reflected light fulfills $-\pi/2<\theta<\pi/2$. Such an arrangement of the secondary structures causes the conservative interference between the main reflected light and the secondary reflected light.

In the two-dimensional photonic crystal surface emitting laser according to the present invention, it is possible to set at will the intensity of the interference between the main reflected light and the secondary reflected light, i.e. the effectiveness of the feedback effect.

Since the intensity of the feedback effect can be set at will as just described, it is possible to prevent lights from localizing in the vicinity of the center of the two-dimensional photonic crystal's surface to generate a laser oscillation. Therefore, even if the area of a two-dimensional photonic crystal is large, a stable laser oscillation can be generated, which enables a higher output of the laser.

In the case where the secondary structures are placed to increase the feedback effect, the light-confining efficiency into the two-dimensional photonic crystal is heightened. Hence, it is possible to generate a laser oscillation even in the case of using a two-dimensional photonic crystal having such a small area that a laser oscillation is difficult to generate with a conventional configuration. Accordingly, it is possible, for example, to downsize the luminescent image element of laser printers and display devices to provide a high-resolution image.

In the case where the modified refractive index areas are arranged in a square lattice pattern, it is preferable that the two-dimensional photonic crystal be symmetrical with respect to an axis which is tilted at 45 degrees to an axis extending in the x-direction or to an axis extending in the y-direction of the square lattice. With this configuration, it is possible to decrease or increase the feedback effect both in the x-direction and y-direction in a similar way. Accordingly, the light is prevented from being unevenly distributed depending on the direction in the two-dimensional photonic crystal, and a further stable laser oscillation in a single wavelength can be generated.

Furthermore, it is preferable that the two-dimensional photonic crystal be asymmetrical with respect to the axis which is orthogonal to the aforementioned axis that is tilted at 45 degrees.

Both the main modified refractive index area and the secondary structure may be preferably be a hole for the reason that they can be easily made and their refractive index greatly differs from that of the matrix body. On the other hand, the main modified refractive index area and the secondary structure may be formed by embedding some sort of member in the matrix body in order to prevent the modified refractive index areas from deforming by the heat that will be applied in the manufacturing process.

In the case where the main modified refractive index area and the secondary structure are made of a material whose refractive index is lower than that of the matrix body, the phase of light does not change when the light is reflected by them.

In the case where the main modified refractive index area and the secondary structure are made of a material whose refractive index is higher than that of the matrix body, the phase of light inverts (changes 180 degrees) when the light is reflected by them. Accordingly, in the case where both the main modified refractive index area and the secondary structure are made of a material whose refractive index is higher than that of the matrix body or where they are both made of a material whose refractive index is lower than that of the matrix body, the feedback effect is restrained the most when the optical path difference between the main reflected light and the secondary reflected light is equal to the wavelength multiplied by a half-integer.

In the case where either one of the main modified refractive index area and the secondary structure is made of a material whose refractive index is higher than that of the matrix body and the other is made of a material whose refractive index is lower than that of the matrix body, the feedback effect is restrained the most when the optical path difference is equal to the wavelength multiplied by an integer.

The secondary structure may be located in the main modified refractive index area, and made of a material whose refractive index differs from that of the main modified refractive index area. In this case, the material of the secondary structure may be preferably identical to that of the matrix body for reasons of manufacturing ease.

DETAILED DESCRIPTION OF PREFERRED EMBODIMENTS

(1) First Embodiment

The first embodiment of a two-dimensional photonic crystal surface emitting laser (simply called "surface emitting laser" hereinafter) according to the present invention will be explained with reference to FIGS. 2 through 8.

Figure 2:
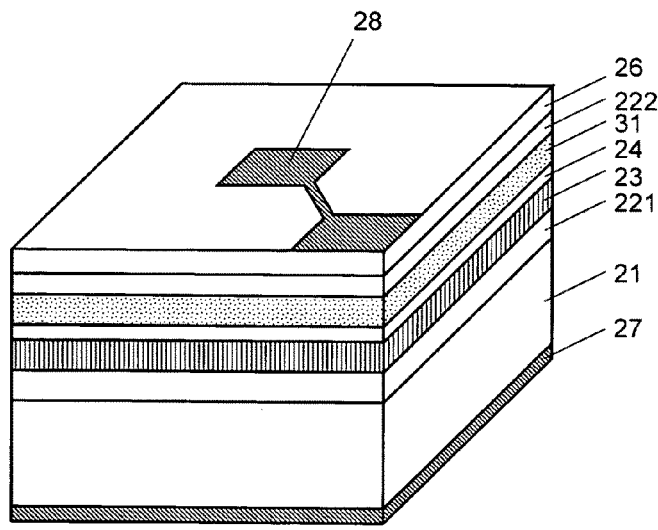
FIG. 2 is a perspective view illustrating the first embodiment of a two-dimensional photonic crystal surface emitting laser according to the present invention.

FIG. 2 is a perspective view of the surface emitting laser according to the present embodiment. It includes a substrate 21 made of an n-type gallium-arsenide (GaAs) semiconductor, which is backed by a cladding layer 221 made of an n-type aluminum gallium-arsenide (AlGaAs) semiconductor. Located on this layer is an active layer 23 made of indium gallium-arsenide (InGaAs)/gallium-arsenide (GaAs), in which multiple-quantum wells (MQW) are present. The active layer 23 is supported by a carrier-blocking layer 24 made of AlGaAs, on which a two-dimensional photonic crystal 31 is provided. The configuration of the two-dimensional photonic crystal 31 will be described later. Located on the two-dimensional photonic crystal 31 is a cladding layer 222 made of p-type AlGaAs and a contact layer 26 made of p-type GaAs. A lower electrode 27 is provided beneath the substrate 21 and an upper electrode 28 on the contact layer 26. Each layer's material described earlier is merely an example and may be any material which has been used in conventional surface emitting lasers.

Figure 3:
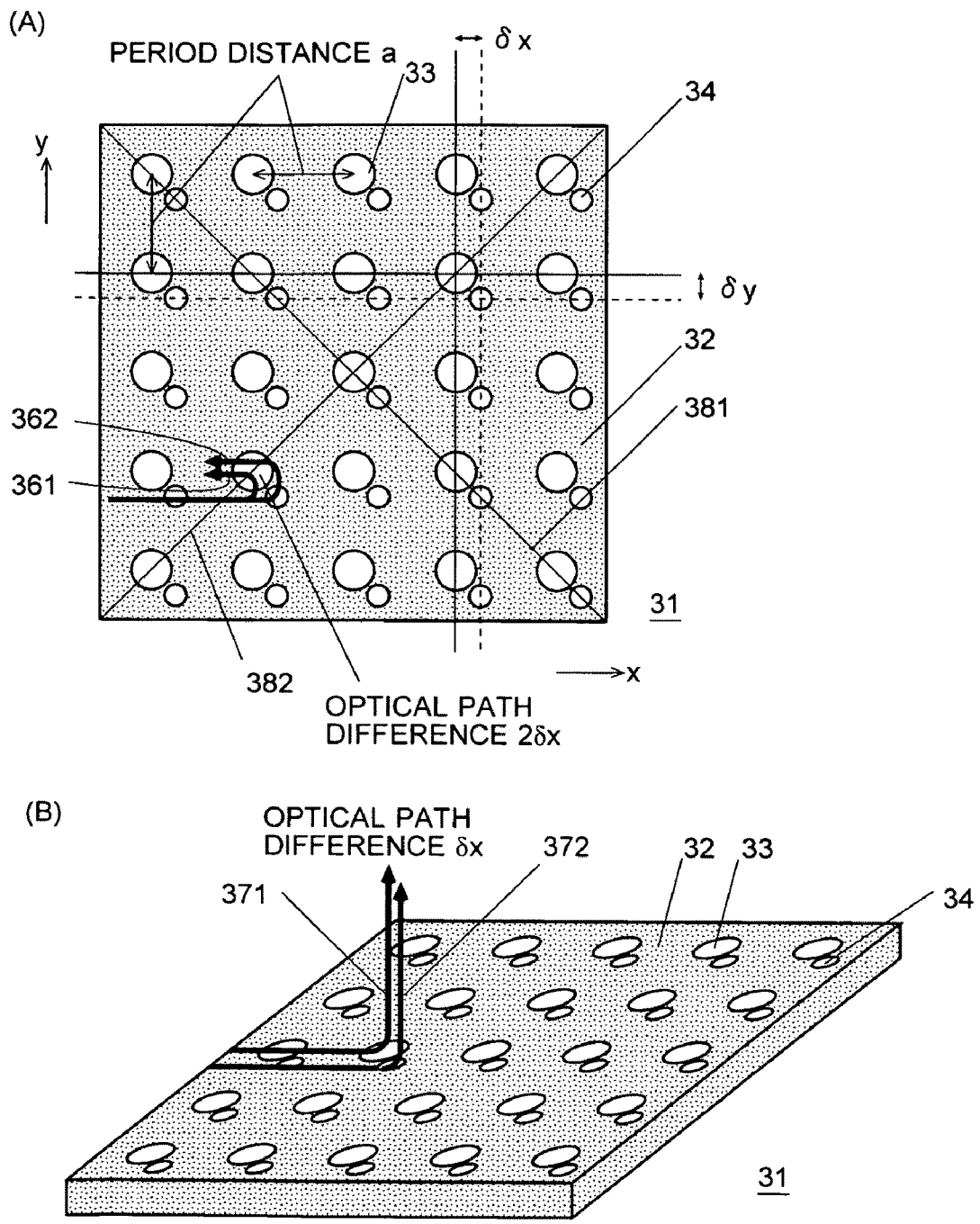
FIG. 3A is a plain view illustrating the two-dimensional photonic crystal 31 in the first embodiment.
FIG. 3B is a perspective view of the same crystal 31.

FIG. 3 illustrates a two-dimensional photonic crystal 31 in a surface emitting laser according to the present embodiment. The two-dimensional photonic crystal 31 includes a dielectric plate-shaped matrix body 32 in which a number of main modified refractive index areas 33 are arranged in a square lattice pattern. Although the main modified refractive index area 33 is a circular hole in the present embodiment, it may be, in place of a hole, an embedded member whose refractive index differs from that of the matrix body 32. The shape of the main modified refractive index area 33 is not limited to that of a circle and may be other forms such as a triangle and quadrangle. In the present embodiment, the horizontal direction of FIG. 3 is called the x-direction of the square lattice and the vertical direction is called the y-direction. The square lattice's period distance is set to "$\alpha$" which equals the wavelength $\lambda$ of the laser light which is to be obtained by this surface emitting laser.

A secondary structure 34 is placed in the vicinity of each of the main modified refractive index areas 33. In the present embodiment, the secondary structure 34 is a circular hole whose diameter is smaller than that of the main modified refractive index area 33. However, its shape may be, as in the case of the main modified refractive index area 33, any form such as a triangle and quadrangle. Alternatively, the secondary structure 34 may be an embedded member whose refractive index differs from that of the matrix body 32. The secondary structure 34 as well as the main modified refractive index area 33 composes the two-dimensional photonic crystal 31. The refractive index of the main modified refractive index area 33 and of the secondary structure 34 will be described later. The secondary structure 34 is placed in the position where it is shifted by a shift amount $\delta x$ in the x-direction and $\delta y$ in the y-direction from a lattice point of the square lattice. Preferably, the values of $\delta x$ and $\delta y$ may be the same so that the restriction or increment of the feedback effect will similarly occur in both the x-direction and y-direction.

To reduce the feedback effect, $\delta x$ and $\delta y$ (optical path difference $2\delta x$ and $2\delta y$) are adjusted, as illustrated in FIG. 3A, so that a main reflected light 361 and a secondary reflected light 362 interfere with each other to be weakened. The main reflected light 361 is the light reflected 180 degrees by the main modified refractive index area 33 among the lights introduced from the active layer 23 to propagate through the two-dimensional photonic crystal 31. The secondary reflected light 362 is the light reflected in the same direction of the main reflected light 361 by the secondary structure 34 which is located in the vicinity of that main modified refractive index area 33. In the case where both the main modified refractive index area 33 and the secondary structure 34 are a hole as in the present embodiment, this interference condition is satisfied by setting both $\delta x$ and $\delta y$ within the range of $0.15\alpha$ through $0.35\alpha$. In this case, as illustrated in FIG. 3B, the optical path difference between a first vertical diffraction light 371 which is diffracted in the direction normal to the surface of the two-dimensional photonic crystal 31 by the main modified refractive index area 33 and a second vertical diffraction light 372 which is diffracted in the same direction of the first vertical diffraction light 371 by the secondary structure 34 located in the vicinity of the main modified refractive index area 33 is between $0.15\alpha/2$ and $0.35\alpha/2$. Therefore, these diffraction lights do not interfere with each other and vanish; i.e. a surface emission can be obtained.

The aforementioned range of $\delta x$ and $\delta y$ may be used, not only in the case where the main modified refractive index area 33 and the secondary structure 34 are a hole, but also in the case where both the refractive index of the main modified refractive index area 33 and that of the secondary structure 34 are lower than that of the matrix body 32 and in the case where both of them are higher than that of the matrix body 32. On the other hand, if either one of the main modified refractive index area 33 or the secondary structure 34 has a lower refractive index than the matrix body 32 and the other has a higher refractive index than the matrix body 32, the phase of the main reflected light 361 and the secondary reflected light 362 are inverted (i.e. 180-degree phase difference occurs) when these lights are reflected by them. Therefore, the range of $\delta x$ and $\delta y$ may be set between $0.30\alpha$ and $0.70\alpha$ in order to reduce the feedback effect.

Figure 1:
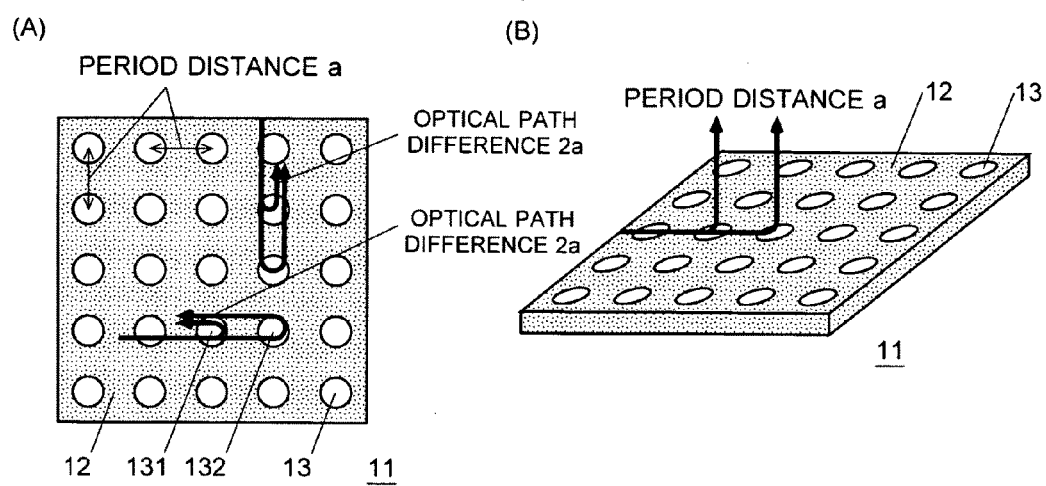
FIG. 1A is a plain view of an example of a two-dimensional photonic crystal in a conventional two-dimensional photonic crystal surface emitting laser, illustrating the interference of lights in the two-dimensional photonic crystal.
FIG. 1B is a perspective view of the same example.

Although not illustrated in FIG. 3, the lights reflected by each of the two adjacent main modified refractive index areas 33 are amplified by interference as in the case of a conventional surface emitting laser which is illustrated in FIG. 1.

As just described, the main reflected light 361 is weakened by the interference with the secondary reflected light 362, which restrains the feedback effect. This prevents the lights amplified in the two-dimensional photonic crystal 31 from localizing in the vicinity of the center of the crystal surface. Accordingly, with the surface emitting laser according to the present embodiment, it is possible to generate a stable laser oscillation even in the case where the two-dimensional photonic crystal 31 has a larger area than conventional lasers, which achieves a higher output of the laser.

In order to obtain the aforementioned effect, the secondary structure 34 may be shifted either in the positive direction or in the negative direction of the x-direction with respect to the main modified refractive index area 33 in the two-dimensional photonic crystal 31. This is because the optical path difference $\delta\lambda$ between the two in-plane reflected lights 361 and 362 is the same in both cases (also in the y-direction).

To increase the feedback effect, $\delta x$ and $\delta y$ are adjusted so that the main reflected light 361 and the secondary reflected light 362 are intensified by interference. In the present embodiment, both $\delta x$ and $\delta y$ may be set between $0.35\alpha$ and $0.50\alpha$ to satisfy this interference condition. Therefore, a laser oscillation can be generated with a small emission area.

The two-dimensional photonic crystal 31 illustrated in FIG. 2 is symmetrical with respect to the first inclined axis 381 which is inclined 45 degrees in the clockwise direction from any axis extending in the x-direction (i.e. 45 degrees in the counterclockwise direction from any axis extending in the y-direction). Owing to this, both the lights traveling in the x-direction and the lights traveling in the y-direction similarly interfere by the reflection at the main modified refractive index area 33 and the secondary structure 34. Therefore, an uneven distribution of light due to direction dependency in the two-dimensional photonic crystal 31 can be prevented, and a stable laser oscillation can be generated.

With respect to the second inclined axis 382 which is orthogonal to the first inclined axis 381, the two-dimensional photonic crystal 31 is asymmetrical. Hence, the laser light taken outside from the two-dimensional photonic crystal surface emitting laser avoids being weakened by interference.

Figure 4:
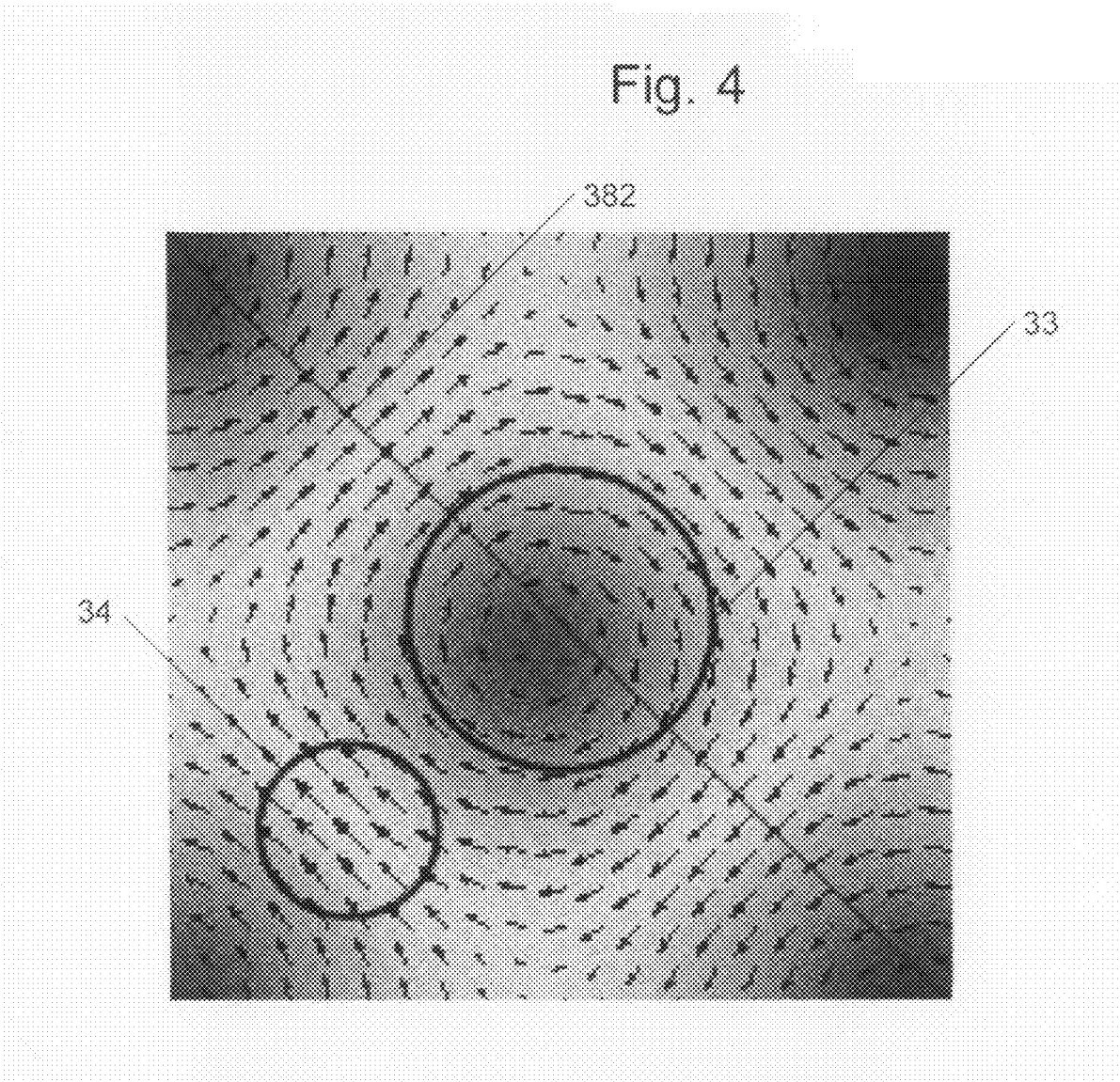
FIG. 4 is a plain view illustrating a calculation result of an electromagnetic field distribution in the two-dimensional photonic crystal 31.

FIG. 4 illustrates a calculation result of the intensity distribution of the electric field and magnetic field in the two-dimensional photonic crystal 31, enlarged around a pair of the main modified refractive index area 33 and secondary structure 34. In this figure, the contrast illustrates the magnetic field's strength, the arrow's direction illustrates the electric field's direction, and the arrow's length illustrates the electric field's strength. This figure shows that the intensity distributions of the magnetic field and that of the electric field are asymmetrical with respect to the second inclined axis 382; for example, the magnetic field's strongest point is away from the center of the main modified refractive index area 33 and toward the secondary structure 34. Such an asymmetric intensity distribution prevents the laser taken outside from being weakened by interference.

Figure 5:
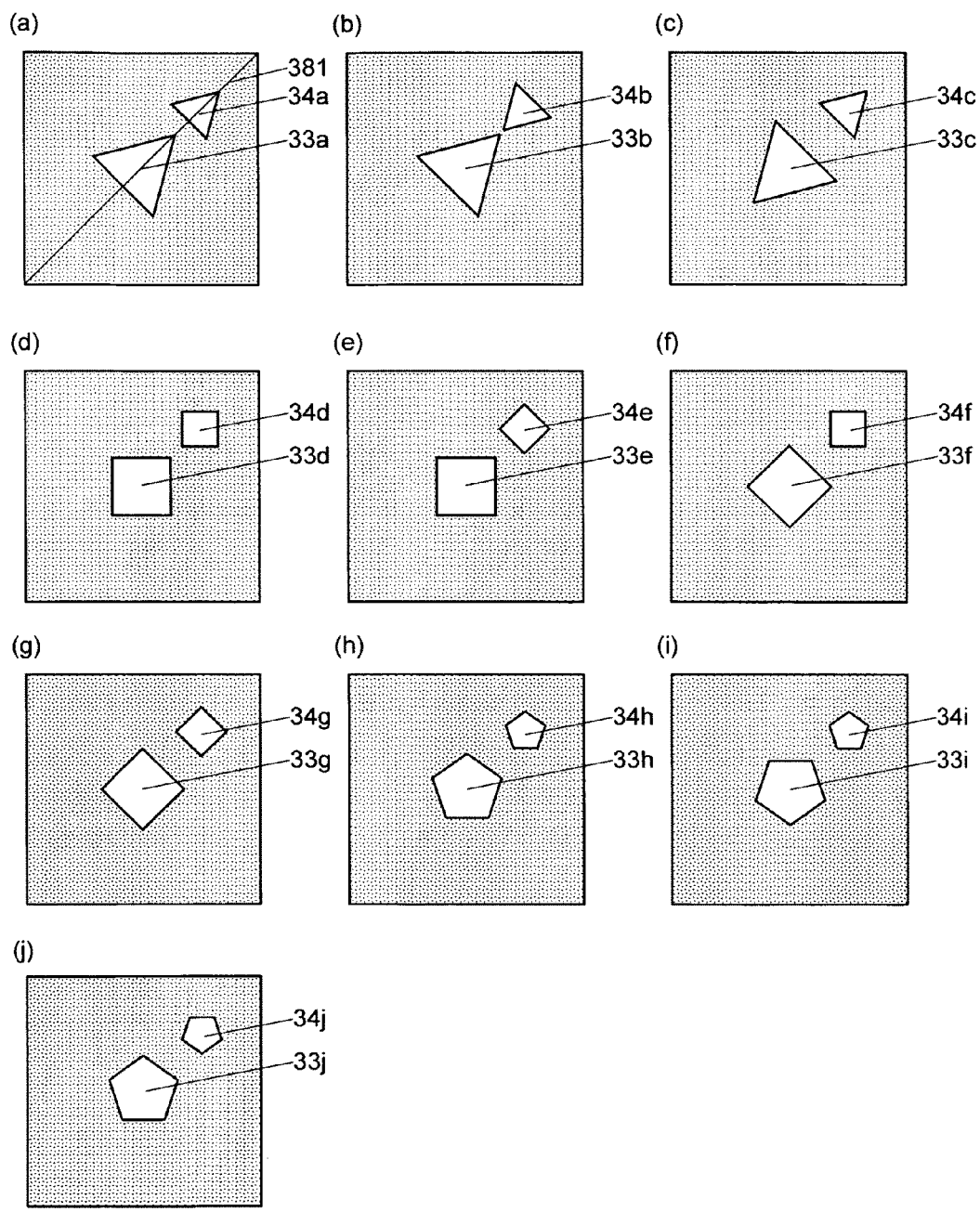
FIG. 5 is a set of plain views illustrating examples of a main modified refractive index area and a secondary structure in a two-dimensional photonic crystal which is symmetrical with respect to the first inclined axis 381 and is asymmetrical with respect to the second inclined axis.

FIG. 5 illustrates examples of a main modified refractive index area and a secondary structure, other than the aforementioned circular ones, in a two-dimensional photonic crystal which is symmetrical with respect to the first inclined axis 381 and is asymmetrical with respect to the second inclined axis. The main modified refractive index areas 33a through 33c and the secondary structures 34a through 34c are equilateral triangles in (a) through (c), the main modified refractive index areas 33d through 33g and the secondary structures 34d through 34g are squares in (d) through (g), and the main modified refractive index areas 33h through 33j and the secondary structures 34h through 34j are equilateral pentagons in (h) through (j). In the case where both a main modified refractive index area and a secondary structure are an equilateral triangle as illustrated in (a) through (c), a two-dimensional photonic crystal can be provided so that it is symmetrical with respect to the first inclined axis 381 by placing the main modified refractive index area and the secondary structure in the following manner: (1) placing a vertex of either of them opposite to a side of the other, (2) placing two vertexes oppositely, and (3) placing two sides oppositely. This can be achieved in the case where the main modified refractive index area and the secondary structure are a square or equilateral pentagon. In addition, although not shown, the two-dimensional photonic crystal can be provided so that it is symmetrical with respect to the first inclined axis in the case where the main modified refractive index area and the secondary structure are an equilateral hexagon, isosceles triangle, rectangle, etc, or in the case where the main modified refractive index area's shape and the secondary structure's shape are different, e.g. the former is a circle and the latter is an equilateral triangle.

Figure 6:
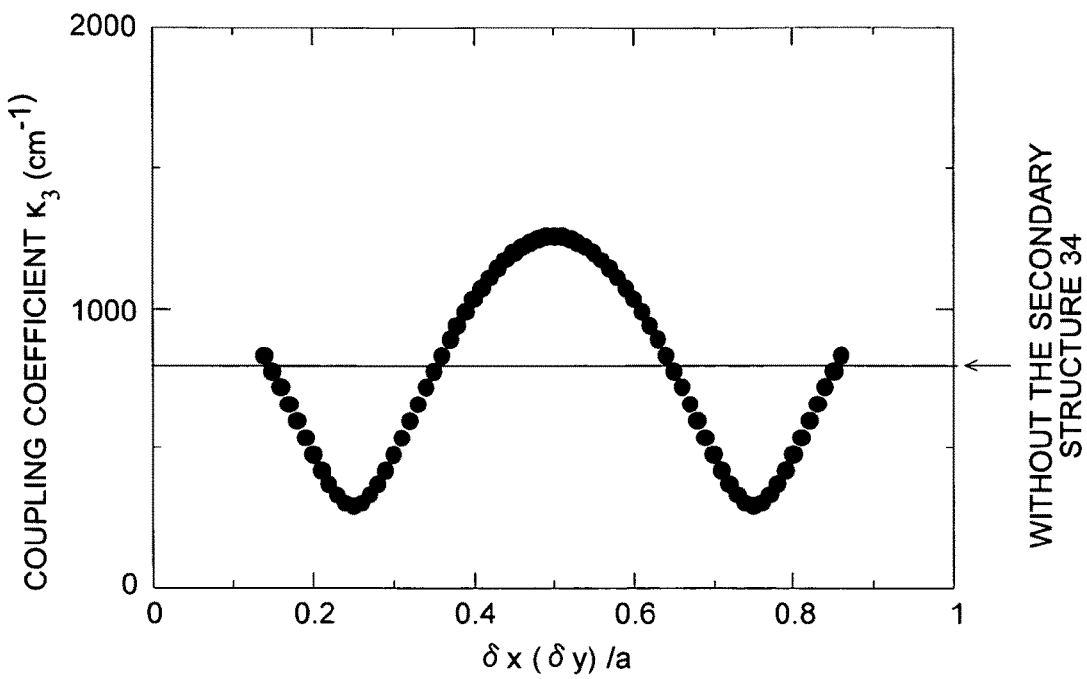
FIG. 6 is a graph showing a calculation result of δx(δy) dependency of coupling coefficient $\kappa_3$.

FIG. 6 shows the calculation result of δx dependency of the coupling coefficient $\kappa_3$, which expresses the intensity of the feedback effect, in the case where δx=δy in the first embodiment. Although the area of the main modified refractive index area 33 was set three times as large as that of the secondary structure 34, the coupling coefficient's qualitative behavior does not depend on their areas. In the case where δx(δy) is larger than 0.5a, it can be thought that the secondary structure 34 belongs to the adjacent main modified refractive index area 33. Hence, in the explanation below, δx(δy) is between 0 and 0.5a.

In the case where δx(δy) is 0.25α, i.e. λ/4, the coupling coefficient $\kappa_3$ becomes the smallest. This corresponds to the fact that the optical path difference between the main reflected light 361 and the secondary reflected light 362 becomes λ/2, and the intensity of the light after interference becomes the smallest. In the case where δx(δy) is between 0.15α and 0.35α, the coupling coefficient $\kappa_3$ can be smaller than in a conventional surface emitting laser without the secondary structure 34, which achieves a stable laser oscillation.

On the other hand, in the case where δx(δy) is between 0.35α and 0.5α, the coupling coefficient $\kappa_3$ can be larger than in a conventional surface emitting laser, which enables a laser oscillation with a smaller emission area. Similarly, in the case where δx(δy) is under 0.14α, the coupling coefficient $\kappa_3$ can be larger than in a conventional surface emitting laser. In this case, however, manufacturing the device is difficult since the main modified refractive index area 33 and the secondary structure 34 are too close.

Figure 7:
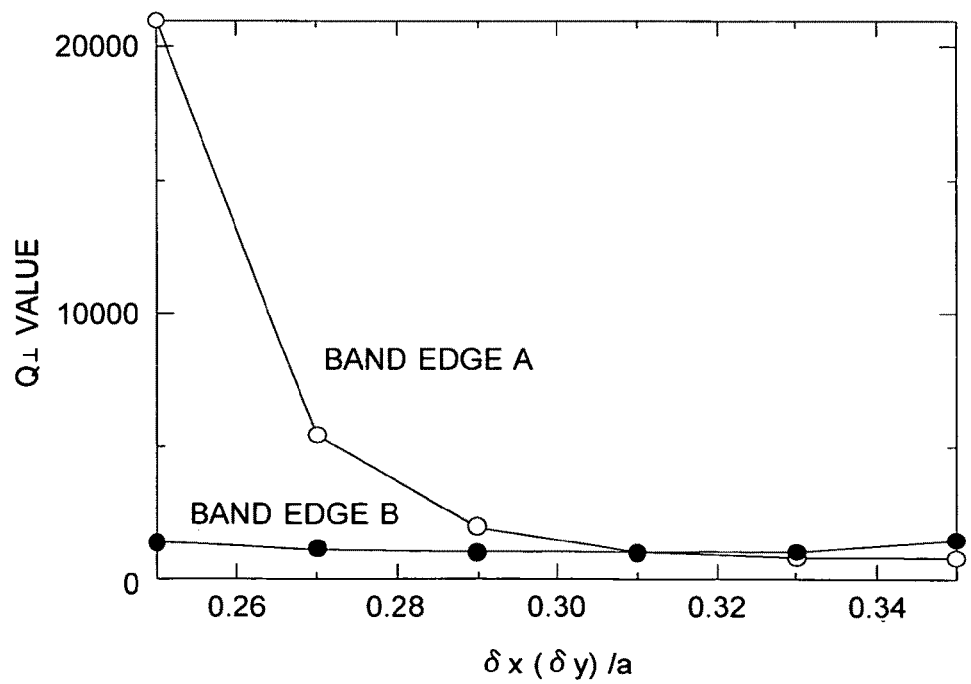
FIG. 7 is a graph showing a calculation result of δx(δy) dependency of $Q_\perp$ value.
Figure 8:
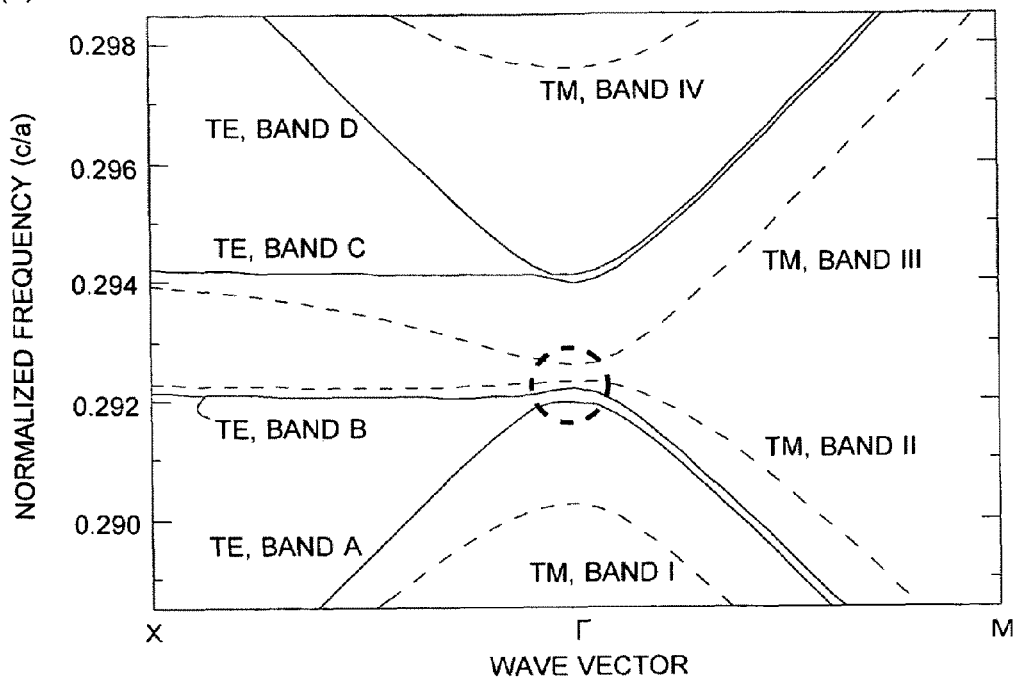
FIGS. 8A and 8B are graphs each illustrating a band structure of a two-dimensional photonic crystal in (A) a conventional two-dimensional photonic crystal surface emitting laser or (B) a two-dimensional photonic crystal surface emitting laser according to the first embodiment.
Figure 8:
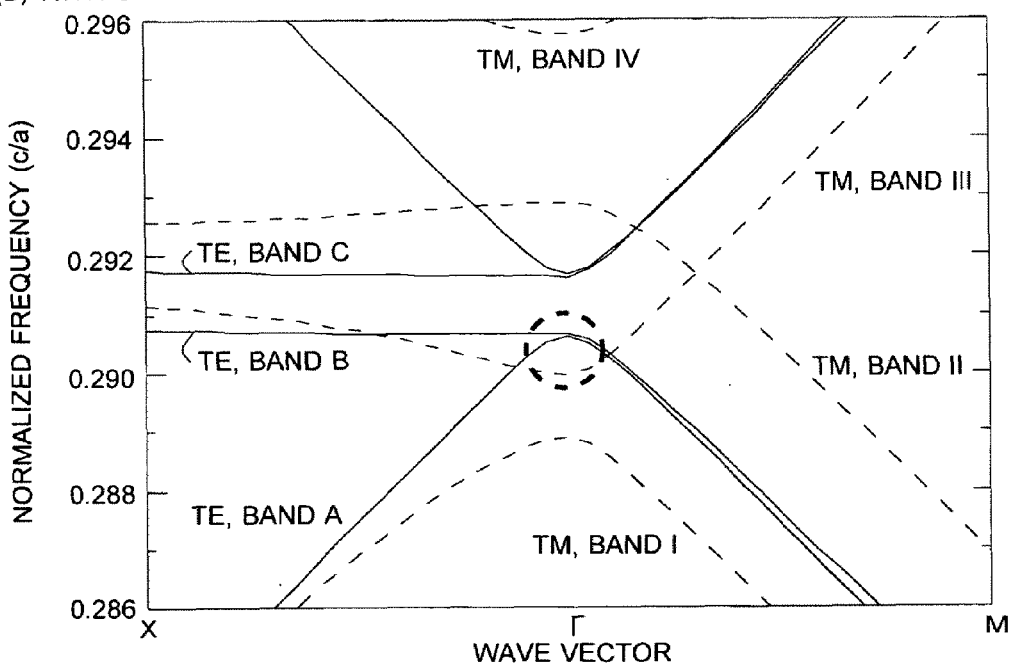

FIG. 7 shows the calculation result of δx dependency of Q value ($Q_\perp$ value) with respect to the direction perpendicular to the surface of the two-dimensional photonic crystal 31 in the case where δx=δy in the first embodiment. The larger the $Q_\perp$ value becomes, the less the light emits from the two-dimensional photonic crystal 31 to the direction perpendicular to its surface. If this value is too large, it is difficult to take out laser light to the direction perpendicular to the surface. Inversely, if it is too small, it is not possible to generate a laser oscillation since lights leak in the direction perpendicular to the surface. For this reason, the $Q_\perp$ value is required to be between a few thousand and several tens of thousands; among them, it may be preferably on the order of 2000 to 6000. FIG. 7 shows that within the calculation range where δx is between 0.25α and 0.35α, the $Q_\perp$ values regarding the band edge A (see FIG. 4) which contributes to a laser oscillation are between a few thousand and several tens of thousands as previously described. FIG. 7 also shows that δx may be preferably between 0.27α and 0.29α to make the $Q_\perp$ value be within the range from 2000 to 6000.

In the first embodiment, it is possible to stabilize the laser oscillation with another factor in addition to the effect of the laser oscillation's stabilization by restraining the feedback as described so far. In conventional two-dimensional photonic crystal surface emitting lasers (without a secondary structure), in the vicinity (inside the dashed circle in FIG. 8A) of the Γ point which contributes to a laser oscillation, the band A and band B in TE mode (Transverse Electric mode) in which an electric field is parallel to a two-dimensional photonic crystal and the band II and band III in TM mode (Transverse Magnetic mode) in which a magnetic field is parallel to the two-dimensional photonic crystal have band structures in which the wavelength values of these bands are close to each other. The Γ point is a point where wave number equals zero in a wave number space. In the TE band B, among these bands, an oscillation possibly occurs in a mode (non-band-edge mode) having a wave number in the flat area (non-band-edge area) which is slightly apart from the Γ point to the X point. The reason why such an oscillation occurs is that the light of the TE band B is coupled with the light of the TM band II because in this area the TE band B is adjacent to the TM band II which has a strong light-confining property, which increases the $Q_\perp$ value of the non-band-edge mode on the TE band B. On the other hand, in the surface emitting laser according to the first embodiment, the TE band B and the TM band III have a large frequency difference in the area from the Γ point toward the X point as illustrated in FIG. 8B. Therefore, it is possible to generate a laser oscillation in a single mode, preventing the oscillation in a non-band-edge mode, which stabilizes a laser oscillation.

(2) Second Embodiment

The second embodiment of a two-dimensional photonic crystal surface emitting laser according to the present embodiment will be described with reference to FIGS. 9 and 10. The surface emitting laser in accordance with the present embodiment has the same structure as that illustrated in FIG. 2, except for a two-dimensional photonic crystal. From this point, the configuration of the two-dimensional photonic crystal according to the second embodiment will be explained.

Figure 9:
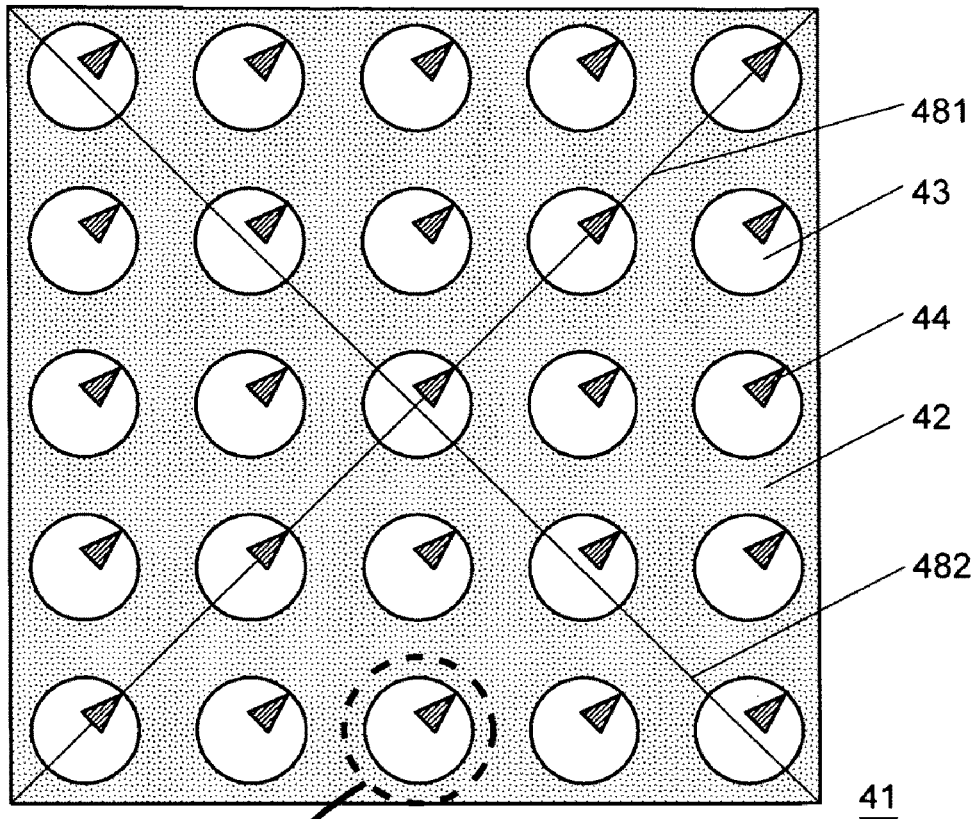
FIG. 9 is a plain view illustrating a two-dimensional photonic crystal 41 in the second embodiment of the two-dimensional photonic crystal surface emitting laser according to the present invention.
Figure 9:
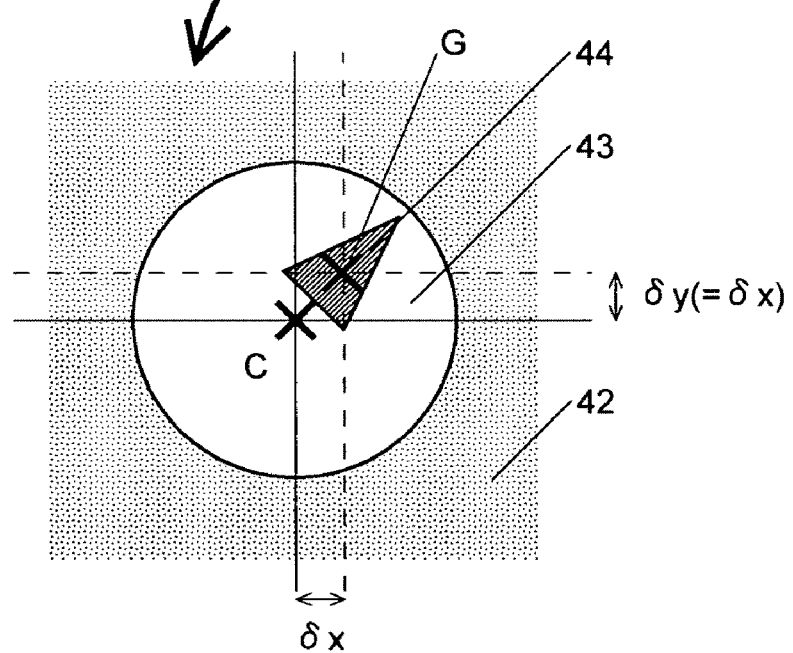

FIG. 9 illustrates a two-dimensional photonic crystal 41 according to the second embodiment. This two-dimensional photonic crystal 41 consists of a plate-shaped matrix body 42 in which a number of main modified refractive index areas 43, each of which is a circular hole, are periodically arranged, e.g. in a square lattice pattern or triangle lattice pattern. In each of the main modified refractive index areas 43, a secondary structure 44 whose shape is an isosceles triangle is provided. The center of gravity G of the secondary structure 44 is a point shifted from the center C of the circle of the main modified refractive index area 43 by the same shift amount $\delta x(=\delta y)$ in the x-direction and y-direction. The secondary structures 44 are arranged so that they may be symmetrical with respect to the first inclined axis 481 and be asymmetrical with respect to the second inclined axis 482. Hence, the whole two-dimensional photonic crystal 41 has the same axial symmetry property as the secondary structures 44. In the present embodiment, the x-direction, y-direction, first inclined axis, and second inclined axis are equally defined as in the first embodiment.

The material of the secondary structure 44 and that of the matrix body 42 may be different. However, they may be the same since the main modified refractive index area 43 and the secondary structure 44 can be simultaneously manufactured by simply making a hole (i.e. the main modified refractive index area 43) on a plate material made with that material. Alternatively, the main modified refractive index area 43 may be an embedded member, in place of a hole, whose material is different from that of the matrix body 42 and of the secondary structure 44. In addition, the shape of the main modified refractive index area 43 is not limited to a circle. Although it is possible to obtain the effect of restraining the feedback of light even in the cases where the values of the shift amounts $\delta x$ and $\delta y$ are different and where the two-dimensional photonic crystal is asymmetrical with respect to the first inclined axis 481, it is preferable to set $\delta x = \delta y$ and to make the two-dimensional photonic crystal be symmetrical to the first inclined axis 481 in order to prevent the uneven distribution of light due to direction dependency in the two-dimensional photonic crystal.

Figure 10:
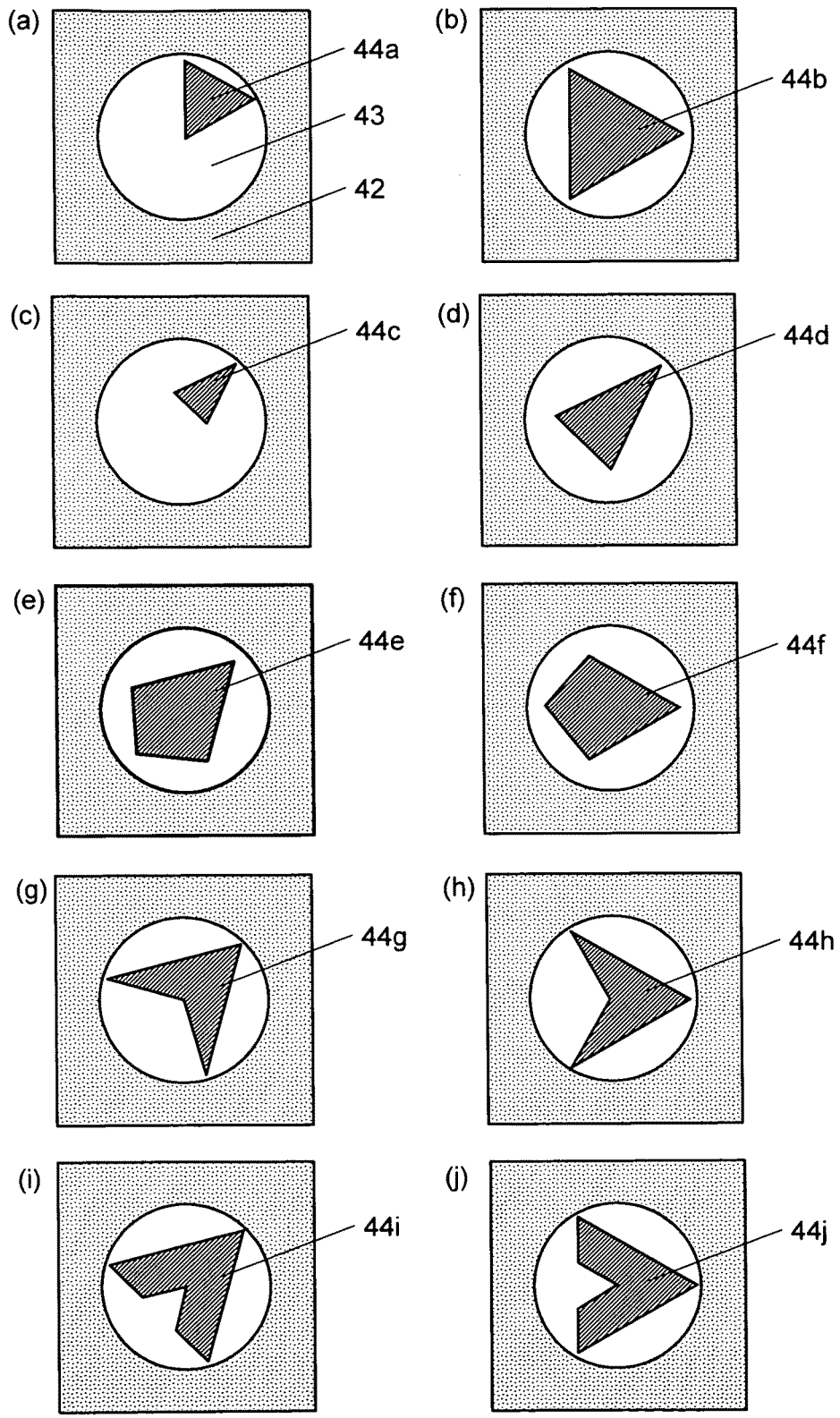
FIG. 10 is a set of plain views illustrating examples of a secondary structure in the second embodiment.

FIG. 10 illustrates modified examples of the secondary structure in the laser light source according to the second embodiment. In (a) and (b), secondary structures 44a and 44b having equilateral-triangular shapes are used, which have different $\delta x$ values due to the difference of the position and size. In (c) and (d), secondary structures 44c and 44d having isosceles triangular shapes are used, which have different $\delta x$ values due to the difference of the position and size as in (a) and (b). In (e) and (f), the secondary structures 44e and 44f have the same shape and size, and $\delta x$ and $\delta y$ are adjusted by placing them in a different direction from each other. This relation is also exhibited in the secondary structures 44g and 44h illustrated in (g) and (h), and in the secondary structures 44i and 44j illustrated in (i) and (j).

What is claimed is:

1. A two-dimensional photonic crystal surface emitting laser, comprising:
   a two-dimensional photonic crystal including a plate-shaped matrix body in which a plurality of main modified refractive index areas, whose refractive index differs from that of a material of the matrix body, are periodically arranged;
   an active layer located on one side of the matrix body for emitting a light having a predetermined wavelength by a current injection, the wavelength being determined so that the light is reflected as a main reflected light by the main modified refractive index areas in the matrix body; and
   secondary structures, each located at an identical relative position with respect to each of the main modified refractive index areas in the matrix body, for reflecting the light having the predetermined wavelength emitted by the active layer as a secondary reflected light in the matrix body, wherein the relative position being set so that the main reflected light and the secondary reflected light interfere at a predetermined phase with each other in a plane of the two-dimensional photonic crystal.

2. The two-dimensional photonic crystal surface emitting laser according to claim 1, wherein the secondary structures are arranged in positions where a phase difference θ between the main reflected light and the secondary reflected light fulfills $\pi/2 < \theta < (3/2)\pi$.

3. The two-dimensional photonic crystal surface emitting laser according to claim 1, wherein the secondary structures are arranged in positions where a phase difference θ between the main reflected light and the secondary reflected light fulfills $-\pi/2 < \theta < \pi/2$.

4. The two-dimensional photonic crystal surface emitting laser according to claim 2, wherein:
   both the main modified refractive index areas and the secondary structures are made of a material whose refractive index is lower than that of the matrix body;
   the main modified refractive index areas are arranged at lattice points of a square lattice having a period distance α; and
   the relative position is away from each of the lattice point by 0.15α through 0.35α in x-direction and 0.15α through 0.35α in y-direction.

5. The two-dimensional photonic crystal surface emitting laser according to claim 2, wherein:
   both the main modified refractive index areas and the secondary structures are made of a material whose refractive index is higher than that of the matrix body;
   the main modified refractive index areas are arranged at lattice points of a square lattice having a period distance α; and
   the relative position is away from each of the lattice point by 0.15α through 0.35α in x-direction and 0.15α through 0.35α in y-direction.

6. The two-dimensional photonic crystal surface emitting laser according to claim 4, wherein the relative position is away from each of the lattice point by $0.25\alpha$ in x-direction and $0.25\alpha$ in y-direction.

7. The two-dimensional photonic crystal surface emitting laser according to claim 5, wherein the relative position is away from each of the lattice point by $0.25\alpha$ in x-direction and $0.25\alpha$ in y-direction.

8. The two-dimensional photonic crystal surface emitting laser according to claim 4, wherein the relative position is away from each of the lattice point by $0.27\alpha$ through $0.29\alpha$ in x-direction and $0.27\alpha$ through $0.29\alpha$ in y-direction.

9. The two-dimensional photonic crystal surface emitting laser according to claim 5, wherein the relative position is away from each of the lattice point by $0.27a$ through $0.29\alpha$ in x-direction and $0.27\alpha$ through $0.29\alpha$ in y-direction.

10. The two-dimensional photonic crystal surface emitting laser according to claim 3, wherein:
    both the main modified refractive index areas and the secondary structures are made of a material whose refractive index is lower than that of the matrix body;
    the main modified refractive index areas are arranged at lattice points of a square lattice having a period distance $\alpha$; and
    the relative position is away from each of the lattice point by $0.35\alpha$ through $0.5\alpha$ in x-direction and $0.35\alpha$ through $0.5\alpha$ in y-direction.

11. The two-dimensional photonic crystal surface emitting laser according to claim 3, wherein:
    both the main modified refractive index areas and the secondary structures are made of a material whose refractive index is higher than that of the matrix body;
    the main modified refractive index areas are arranged at lattice points of a square lattice having a period distance $\alpha$; and
    the relative position is away from each of the lattice point by $0.35\alpha$ through $0.5\alpha$ in x-direction and $0.35\alpha$ through $0.5\alpha$ in y-direction.

12. The two-dimensional photonic crystal surface emitting laser according to claim 1, wherein either one of the main modified refractive index area and the secondary structure is made of a material whose refractive index is lower than that of the matrix body and the other is made of a material whose refractive index is higher than that of the matrix body.

13. The two-dimensional photonic crystal surface emitting laser according to claim 1, wherein the main modified refractive index area and the secondary structure are a hole.

14. The two-dimensional photonic crystal surface emitting laser according to claim 1, wherein the secondary structure is located in the main modified refractive index area, and is made of a material whose refractive index differs from that of the main modified refractive index area.

15. The two-dimensional photonic crystal surface emitting laser according to claim 1, wherein the secondary structure is located in the main modified refractive index area, and is made of a material which is identical to that of the matrix body.

16. The two-dimensional photonic crystal surface emitting laser according to claim 1, wherein the main modified refractive index areas are arranged in a square lattice pattern, and the two-dimensional photonic crystal is symmetrical with respect to an axis which is tilted at 45 degrees to an axis extending in x-direction or to an axis extending in y-direction of the square lattice.

17. The two-dimensional photonic crystal surface emitting laser according to claim 16, wherein the two-dimensional photonic crystal is asymmetrical with respect to an axis which is orthogonal to the axis which is tilted at 45 degrees to an axis extending in the x-direction or to an axis extending to the y-direction of the square lattice.

* * * * *